United States Patent
Sakurai

(10) Patent No.: US 11,264,265 B2
(45) Date of Patent: Mar. 1, 2022

(54) LIFT PIN, AND EPITAXIAL GROWTH APPARATUS AND METHOD OF PRODUCING SILICON EPITAXIAL WAFER USING THE LIFT PIN

(71) Applicant: SUMCO CORPORATION, Tokyo (JP)

(72) Inventor: Masaya Sakurai, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 39 days.

(21) Appl. No.: 16/476,151

(22) PCT Filed: Dec. 19, 2017

(86) PCT No.: PCT/JP2017/045443
§ 371 (c)(1),
(2) Date: Jul. 5, 2019

(87) PCT Pub. No.: WO2018/142788
PCT Pub. Date: Aug. 9, 2018

(65) Prior Publication Data
US 2019/0355612 A1    Nov. 21, 2019

(30) Foreign Application Priority Data
Feb. 2, 2017 (JP) .............................. JP2017-017890

(51) Int. Cl.
*C30B 23/00* (2006.01)
*H01L 21/687* (2006.01)
(Continued)

(52) U.S. Cl.
CPC ........ *H01L 21/68742* (2013.01); *C30B 23/00* (2013.01); *C30B 25/06* (2013.01); *C30B 25/12* (2013.01); *H01L 21/6835* (2013.01)

(58) Field of Classification Search
CPC ......... C30B 25/00; C30B 23/00; C23C 16/24; C23C 16/44
See application file for complete search history.

(56) References Cited

U.S. PATENT DOCUMENTS 6,596,086 B1    7/2003 Honma et al.
7,754,609 B1 *  7/2010 Tan .......................... B08B 3/12
                                                        438/689

(Continued)

FOREIGN PATENT DOCUMENTS

EP    WO 2009070006    *  7/2009
JP         H11-329977 A     11/1999
(Continued)

OTHER PUBLICATIONS

U.S. Appl. No. 16/491,274 to Keiko Matsuo et al., which was filed Sep. 5, 2019.

(Continued)

*Primary Examiner* — Robert M Kunemund
(74) *Attorney, Agent, or Firm* — Greenblum & Bernstein, P.L.C.

(57) ABSTRACT

Provided is a lift pin for an epitaxial growth apparatus, which can prevent the back surface of a silicon wafer from being damaged by the lift pin, reduce emission of dust due to the rubbing of the lift pin against the wall surface of a through hole in a susceptor, and prevent peeling of glassy carbon. The lift pin has a straight trunk part to be inserted through the through hole; a head part to be made to abut a silicon wafer; and a cover part covering at least a top of the head part. The straight trunk part and the head part are made of a porous body, the cover part is made of a carbon-based covering material, and at least part of voids of the porous body of the head part is filled with the cover part.

4 Claims, 3 Drawing Sheets

(51) Int. Cl.
*C30B 25/06* (2006.01)
*C30B 25/12* (2006.01)
*H01L 21/683* (2006.01)

(56) References Cited

U.S. PATENT DOCUMENTS

| | | | |
|---|---|---|---|
| 2003/0075109 A1* | 4/2003 | Arai | C23C 16/4581 |
| | | | 118/728 |
| 2003/0178145 A1* | 9/2003 | Anderson | H01L 21/68735 |
| | | | 156/345.51 |
| 2011/0114014 A1* | 5/2011 | Sakurai | C23C 16/46 |
| | | | 117/88 |
| 2018/0100235 A1 | 4/2018 | Nogami et al. | |
| 2018/0135166 A1 | 5/2018 | Sakurai | |
| 2018/0135172 A1 | 5/2018 | Nogami et al. | |

FOREIGN PATENT DOCUMENTS

| | | |
|---|---|---|
| JP | 2000-26192 A | 1/2000 |
| JP | 2003-142407 A | 5/2003 |
| JP | 2004-356124 A | 12/2004 |
| JP | 2016-92129 A | 5/2016 |
| JP | 2016-92130 A | 5/2016 |
| JP | 2016-225445 A | 12/2016 |
| WO | WO 2009/070006 A1 | 6/2009 |

OTHER PUBLICATIONS

International Search Report issued in WIPO Patent Application No. PCT/JP2017/045443, dated Mar. 27, 2018.
International Preliminary Report on Patentability issued in WIPO Patent Application No. PCT/JP2017/045443, dated Aug. 15, 2019.
Office Action issued in Japan Counterpart Patent Appl. No. 2018-565980, dated May 12, 2020, along with an English translation thereof.
Office Action for KR App. No. 10-2019-7019694, dated Nov. 28, 2020 (w/ translation).
Office Action for DE App. No. 11 2017 006 987.4, dated Mar. 29, 2021 (w/ translation).
Office Action for DE App. No. 11 2017 006 987.4, dated Aug. 2, 2021 (w/ translation).

* cited by examiner

LIFT PIN, AND EPITAXIAL GROWTH APPARATUS AND METHOD OF PRODUCING SILICON EPITAXIAL WAFER USING THE LIFT PIN

TECHNICAL FIELD

This disclosure relates to a lift pin, and an epitaxial growth apparatus and a method of producing a silicon epitaxial wafer using the lift pin.

BACKGROUND

A silicon wafer is typically obtained by growing a single crystal silicon by the Czochralski (CZ) process, etc., cutting the single crystal silicon into blocks, then slicing a resultant block thin, and subjecting a resultant slice to a surface grinding (lapping) step, an etching step, and a mirror surface polishing (polishing) step, followed by final cleaning. Such a silicon wafer is subsequently shipped as a product if various quality inspections observe no abnormality.

Here, for example when crystal integrity is further required or when a multi-layer structure having layers of different resistivity is needed, a silicon epitaxial wafer is produced by growing a single crystal silicon thin film on the silicon wafer by vapor phase growth (epitaxial growth).

For silicon epitaxial wafer production, a single-wafer processing epitaxial growth apparatus is used for example. Here, a typical single wafer-processing epitaxial growth apparatus will be described with reference to FIG. 1. As illustrated in FIG. 1, an epitaxial growth apparatus 1 has an upper dome 11, a lower dome 12, and an epitaxial film formation chamber 2 surrounded by a dome fitting 13. This epitaxial film formation chamber 2 is provided with a gas supply port 31 and a gas exhaust port 32 for supplying and exhausting a reaction gas at opposite positions in the side of the chamber. On the other hand, a susceptor 4 on which a silicon wafer W is to be placed is situated in the epitaxial film formation chamber 2. An outer part of the lower surface of the susceptor 4 is engaged with and supported by susceptor support shafts 41 connected to a susceptor rotating portion 40, and the susceptor 4 is rotated with the susceptor support shafts 41. Further, through holes 42, through which lift pins 5 for raising and lowering the silicon wafer W pass, are formed in the susceptor 4. The lift pins 5 are raised and lowered with their base ends being supported by elevating shafts 6.

A more detailed description is given with reference to an enlarged view of one of the through holes 42 in the susceptor 4 and its vicinity illustrated in FIG. 2 and an enlarged view of one of the lift pins 5 illustrated in FIG. 3. The lift pin 5 has a head part 52 abutting the silicon wafer W and a straight trunk part 51 inserted through the through hole 42 in the susceptor 4. The silicon wafer W introduced into the epitaxial film formation chamber 2 is temporarily supported by the lift pins 5 by moving the lift pins 5 inserted through the through holes 42 in the susceptor 4 to above the susceptor 4 and making the head parts 50 of the lift pins 5 abut against the back surface of the silicon wafer W as illustrated in FIG. 2. Here, the elevating movement of the lift pins 5 is performed through the elevating movement of the elevating shafts 6 supporting the base ends of the lift pins 5.

Next, the susceptor support shafts 41 supporting the susceptor 4 are elevated to move the susceptor 4 to the position of the silicon wafer W, thus the silicon wafer W is placed on the susceptor 4. In this state, the head part 52 of each lift pin 5 is received in the through hole 42 in the susceptor 4. In this manner, the silicon wafer W is placed on the susceptor 4. A silicon epitaxial wafer is produced by while heating the silicon wafer W to a temperature of 1000° C. or more using a plurality of heating lamps 14 arranged above and below the susceptor 4 for example, supplying a reaction gas into the epitaxial film formation chamber 2, and growing an epitaxial film having a predetermined thickness.

After the epitaxial growth, the susceptor 4 is lowered by lowering the support shafts 41. This lowering is performed up to a position where the lift pins 5 are supported by the elevating shafts 6 and protrude from the susceptor 4, thus the silicon wafer W is supported by the lift pins 5. Then, a transfer blade, not illustrated, is introduced into the epitaxial film formation chamber 2, and the silicon wafer W is placed on the transfer blade by lowering the lift pins 5 to deliver the silicon wafer W from the lift pins 5 to the transfer blade. After that, the silicon wafer W is discharged from the growth apparatus 1 along with the transfer blade.

In the above-described production process of a silicon epitaxial wafer, in steps up to the placement of the silicon wafer W introduced into the growth apparatus 1 on the susceptor 4 and in the step of transferring the silicon wafer W having been subjected to epitaxial growth from the susceptor 4 to the transfer blade, the silicon wafer W abuts and is supported by the lift pins 5. The head parts 52 of the lift pins 5 abut the back surface of the silicon wafer while the lift pins 5 are elevated, and the head parts remain in contact with the wafer, which would cause the formation of flaws on parts of the wafer in contact with the head parts.

Further, in, before, and after the above steps, the lift pins 5 are necessarily raised or lowered, the elevating and lowering movements of the lift pins 5 cause emission of dust due to rubbing of the straight trunk part 51 of each lift pin 5 against the wall surface of the through hole 42 in the susceptor 4. This dust deposits as particles on the epitaxial film surface and degrades the silicon wafer quality. Therefore, it is desired to reduce such dust.

With this being the situation, JP 2003-142407 A (PTL 1) proposes a lift pin including a sheath part formed from SiC and a glassy carbon head part fit in the sheath part.

CITATION LIST

Patent Literature

PTL 1: JP 2003-142407 A

SUMMARY

Technical Problem

For the lift pin disclosed in PTL 1, the surface of the lift pin in contact with a silicon wafer is made of a material having hardness lower than that of the silicon wafer. Accordingly, this lift pin is believed to prevent the formation of flaws at positions where the head parts and the silicon wafer come in contact with one another. Further, since the sheath part of this lift pin and at least the surface of the susceptor 4 are formed from the same material of SiC, this lift pin is believed to prevent emission of dust due to rubbing of the straight trunk part of the lift pin against the wall surface of the through hole 42 when the lift pin is raised or lowered.

However, since the head part is fit in the sheath part in PTL 1, the fit-in portion would crack due to the thermal expansion difference between the materials of the head part and the sheath part in heat treatment for epitaxial growth, thus this structure would not be applicable.

In view of the above, we contemplated preparing a lift pin formed from an SiC base material, of which top is coated with a carbon-based covering material made of glassy carbon, instead of a lift pin having a head part made of glassy carbon fit into a hollow sheath part as described in PTL 1. However, when test lift pins prepared as described above were used in an epitaxial growth apparatus, the carbon-based covering material peeled.

It could therefore be helpful to provide a lift pin for an epitaxial growth apparatus, which can prevent peeling of a carbon-based covering material.

Solution to Problem

We diligently studied ways to solve the above problem, and assumed that the cause of the peeling from the test lift pins was due to the lack of adhesion between the carbon-based covering material and the SiC base material. While the SiC base material possesses a close-packed SiC structure, the carbon-based covering material applied onto the SiC substrate forms a simple layered structure, which is considered to result in the peeling during epitaxial growth due to thermal expansion difference. To address this, we contemplated using a porous body instead of an SiC base material as the base material of a lift pin, and found that such a lift pin is advantageous in terms of solving any of the above problems. This discovery led to the completion of this disclosure.

Specifically, we propose the following features.

(1) A lift pin which is inserted through a through hole of a susceptor placed in an epitaxial growth apparatus so that the lift pin is movable in directions in which the through hole extends, and moves a silicon wafer placed on the susceptor up and down with respect to the susceptor while supporting the silicon wafer, comprising:
  a straight trunk part inserted through the through hole;
  a head part abutting the silicon wafer; and
  a cover part covering at least a top of the head part,
  wherein the straight trunk part and the head part are made of a porous body,
  the cover part is made of a carbon-based covering material, and
  at least part of voids of the porous body of the head part is filled with the cover part.

Note that "abut" herein means a state where a head of a lift pin is "connected" or "attached" to the back surface of a silicon wafer with a cover part having a surface layer thickness of 1 μm to 100 μm, which is sufficiently smaller than the thickness of the head part, therebetween when epitaxial growth is performed. The surface layer thickness is the thickness on the central axis of the lift pin from the outermost surface of the lift pin on the head part side (the exposed surface of the cover part) to the surface of the head part on the abutment side.

(2) The lift pin according to (1) above, wherein the porous body is made of porous SiC or a porous carbon material.

(3) The lift pin according to (1) or (2) above, wherein the straight trunk part is coated with an SiC coating material.

(4) The lift pin according to any one of (1) to (3) above, wherein a porosity of the porous body is 15% or more and 85% or less.

(5) The lift pin according to any one of (1) to (4) above, wherein the carbon-based covering material of the cover part is made of glassy carbon or pyrolytic carbon.

(6) An epitaxial growth apparatus having the lift pin according to any one of (1) to (5) above.

(7) A method of producing a silicon epitaxial wafer by which an epitaxial film is grown on a silicon wafer using the epitaxial growth apparatus according to (6) above.

Advantageous Effect

This disclosure provides a lift pin for an epitaxial growth apparatus, which can prevent peeling of a carbon-based covering material.

BRIEF DESCRIPTION OF THE DRAWINGS

In the accompanying drawings.

DETAILED DESCRIPTION

Figure 1:
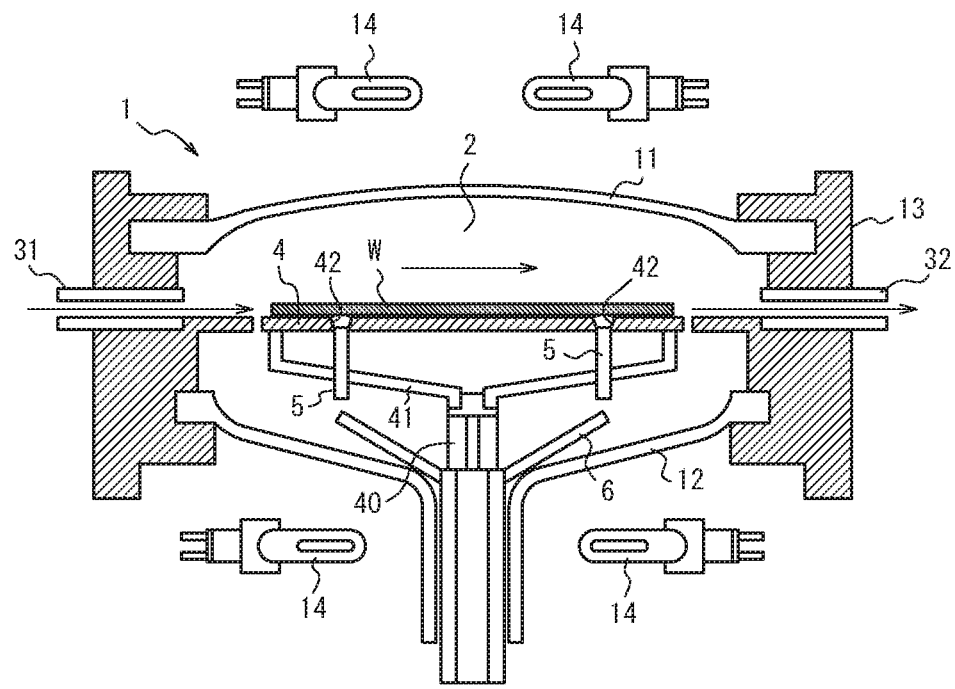
FIG. 1 is a cross-sectional view of an epitaxial growth apparatus according to conventional techniques.
Figure 2:
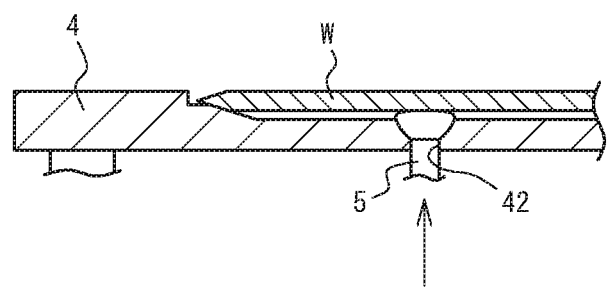
FIG. 2 is a cross-sectional view illustrating a through hole of a susceptor and its vicinity in a conventional epitaxial growth apparatus according to conventional techniques.

A lift pin of this disclosure will now be described in detail with reference to the drawings. Note that the components in the drawings are vertically exaggerated for convenience of description, and the vertical and horizontal scales are different.

Figure 4:
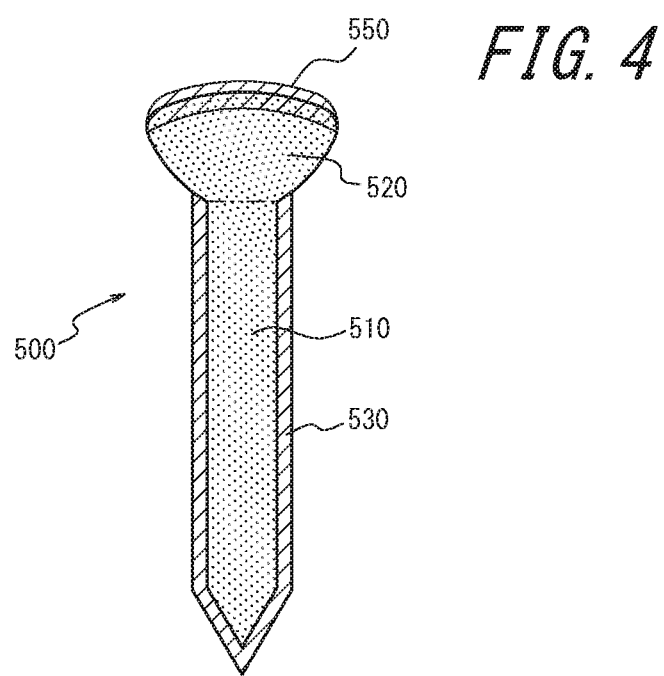
FIG. 4 is a cross-sectional view illustrating a lift pin according to one embodiment of this disclosure.

FIG. 4 is a cross-sectional view illustrating a lift pin 500 according to this embodiment. The lift pin 500 is inserted through the through hole 42 in the susceptor 4 provided in the epitaxial growth apparatus 1 described above with reference to FIG. 1 so that the lift pin 500 is movable in directions in which the through hole extends, and moves the silicon wafer W placed on the susceptor 4 up and down with respect to the susceptor 4 while supporting the silicon wafer W. Accordingly, the lift pin 500 according to this embodiment can be used in place of the lift pin 5 inserted through the through hole 42 in the susceptor 4 of the epitaxial growth apparatus 1 according to conventional techniques, illustrated in FIG. 1.

Here, the lift pin 500 has a straight trunk part 510 inserted through the through hole 42, a head part 520 to be in contact with the silicon wafer W, and a cover part 550 covering at least the top of the head part 520. Accordingly, the interface where the lift pin 500 is in contact with the silicon wafer W is an exposed surface 550A of the cover part 550 (outermost surface of the lift pin 500). As illustrated in FIG. 4, the straight trunk part 510 can have a rod shape, and the head part 520 can have a diameter larger than that of the straight trunk part 510 and the through hole 42. Note that the shape of the lift pin 500 according to this embodiment is not necessarily limited as long as the lift pin 500 has a head part supporting a silicon wafer at the tip of the rod-shaped straight trunk part. Thus, the shape of the lift pin is not limited to the shape illustrated in the drawing. The lift pin 500 may have a suitable shape in accordance with the susceptor 4.

Figure 5:
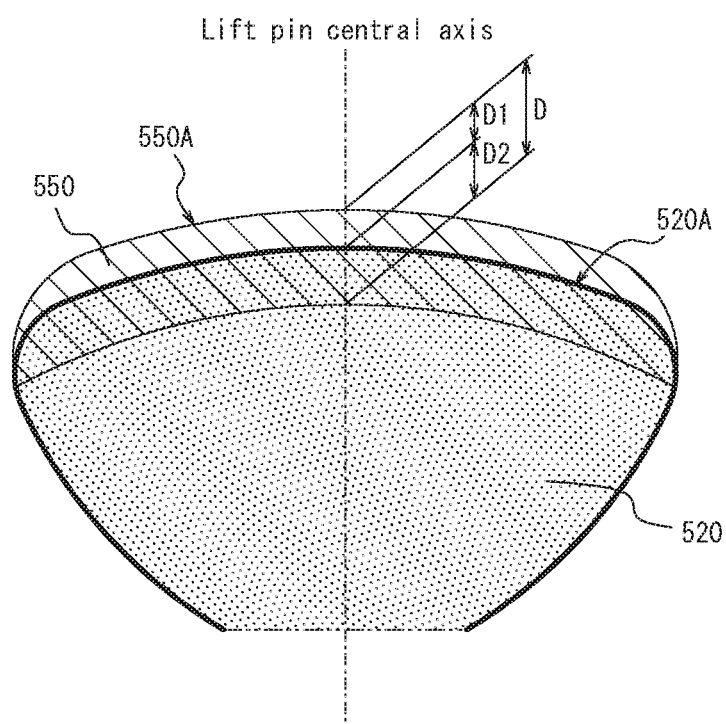
FIG. 5 is an enlarged cross-sectional view of a head part of a lift pin according to one embodiment of this disclosure.

Here, in the lift pin 500, the straight trunk part 510 and the head part 520 are made of a porous body, and the cover part 550 is made of a carbon-based covering material. Further, in the lift pin 500, at least part of the voids of the porous body of the head part 520 is filled with the cover part 550. In this specification, as illustrated in FIG. 5, which is an enlarged view of the head part 520 side of the lift pin 500, the thickness D of the cover part 550 is defined by the total thickness of the surface layer thickness D1 and the deep part thickness D2 (D1+D2). Specifically, the surface layer thickness D1 is the thickness on the central axis of the lift pin 500 from the exposed surface 550A of the cover part 550 (the outermost surface of the lift pin 500, which is in direct contact with the back surface of a silicon epitaxial wafer when epitaxial growth is performed) to the surface 520A of the head part 520 on the abutment side. Meanwhile, the deep part thickness D2 is the thickness on the central axis of the lift pin 500 from the surface 520A of the head part 520 on the abutment side to a surface part filled with the cover part 550.

Since the lift pin 500 according to this embodiment has the above filled structure, adhesion between the cover part 550 made of a carbon-based covering material and the head part 520 made of a porous body can be ensured. Accordingly, even when the lift pin 500 is used in the epitaxial growth apparatus 1, the carbon-based covering material can be prevented from peeling.

Note that the surface layer thickness D1 of the cover part 550 is typically 1 μm to 100 μm, which is sufficiently smaller than the thickness of the head part 520 of the lift pin 500. Further, the deep part thickness D2 of the cover part 550 made of a carbon-based covering material, filling the voids of the porous body is preferably 50 μm or more, more preferably 100 μm or more. This causes the anchor effect and provides a structure in which the cover part 550 is less likely to peel. Further, the voids of the porous body of the head part 520 may be wholly filled with the cover part 550. The total thickness D of the entire cover part 550 is preferably 100 μm or more, and is preferably 300 μm or less considering the efficiency in producing the lift pins 500.

Further, as described above, the interface where the lift pin 500 is in contact with the silicon wafer W is an exposed surface 550A of the cover part 550, so that the carbon-based covering material is in contact with the silicon wafer W. Accordingly, the carbon-based covering material is preferably a material having lower hardness than the silicon wafer W. This ensures that the back surface of the silicon wafer is more reliably prevented from being damaged by the lift pin 500. Glassy carbon, pyrolytic carbon, or the like is preferably used as such a carbon-based covering material. Note that those carbon-based covering materials given above are preferred partly due to its heat resistance for withstanding use in an epitaxial growth apparatus (approximately 1200° C. at highest) and its resistance to HCl used as an etching gas. Further, those carbon-based covering materials are also advantageous since they do not contain an element resulting in an active level in a silicon epitaxial wafer. Moreover, one of those carbon-based covering materials is advantageously used in terms achieving temperature uniformity in the plane of a silicon wafer during the growth of an epitaxial film.

Further, the porous body forming the straight trunk part 510 and the head part 520 is preferably made of porous SiC or a porous carbon material. Porous SiC may preferably be used since the portion of the lift pin 500 in contact with the wall surface of the through hole 42 in the susceptor 4 is the same material of SiC, which further ensures that emission of dust due to rubbing between them is prevented. On the other hand, a porous carbon material is preferred since at least part of the voids of the porous body is easily filled with the cover part 550, and peeling hardly occurs.

In the lift pin 500 according to this disclosure, a structure composed of the straight trunk part 510 and the head part 520 can be obtained by a typical technique. For example, when porous SiC forms the structure composed of the straight trunk part 510 and the head part 520, the structure can be formed by dispersing pores in an SiC sintered body obtained by sintering at normal pressure.

The cover part 550 made of a carbon-based covering material is formed on the top of the head part 520. For example, when glassy carbon is used as the carbon-based covering material, a thermosetting resin such as a phenol resin or COPNA resin is dissolved in a solvent, and the resultant liquid solution is applied to the top surface of the head part 520 with a brush, by spraying, or by other techniques. Further, after the liquid solution is dried and cured, heat treatment can be performed at 700° C. to 2600° C. in an atmosphere of an inert gas such as argon, thereby forming the cover part 550 made of glassy carbon. The voids in the porous body of the head part 520 are filled with the thus formed cover part 550 since the glassy carbon infiltrates the head part 520. In this case, the deep part thickness D2 of the cover part 550 is contributed by the infiltration.

Alternatively, the cover part 550 made of glassy carbon may be formed in the following manner. A thermosetting resin such as a phenol resin, which is a feedstock of glassy carbon may be carbonized by performing one or both of an impregnation procedure and a coating procedure on part or the whole of the head part 520, thereby forming the cover part 550 made of glassy carbon. Note that a furan resin, a polycarbodiimide resin, a furfural-phenol copolymer, a divinylbenzene resin, COPNA resin, etc. can be used as the thermosetting resin other than a phenol resin. In this case, the deep part thickness D2 of the cover part 550 is contributed by the impregnation.

On the other hand, when pyrolytic carbon is used as the carbon-based covering material, a hydrocarbon material may be deposited by being sprayed or applied to part or the whole of the top of the head part 520 using for example thermal CVD at 800° C. or more. The voids in the porous body of the head part 520 are filled with the thus formed cover part 550 since the pyrolytic carbon infiltrates the head part 520. In this case, the deep part thickness D2 of the cover part 550 is contributed by the infiltration. Note that pyrolytic carbon is highly pure and highly crystalline carbon obtained by thermally decomposing a hydrocarbon-based compound having around 1 to 8 carbon atoms, examples of known pyrolytic carbon include pyrocarb (manufactured by IBIDEN CO., LTD.) and PYROGRAPH (manufactured by TOYO TANSO CO., LTD., PYROGRAPH is a registered trademark in Japan, other countries, or both).

It will be appreciated that the technique for producing the cover part 550 of the lift pin 500 according to this embodiment is not limited by the concrete examples described above.

Further, the straight trunk part 510 is preferably coated with an SiC coating material 530. This can more reliably prevent emission of dust due to rubbing between the lift pin 500 and the wall surface of the through hole 42 in the susceptor 4. The SiC coating material 530 can be formed by chemical vapor deposition (CVD). Note that the thickness of the coating with the SiC coating material 530 on the straight trunk part 510 is preferably 40 μm or more, more preferably 60 μm or more.

Further, in order to further ensure the above effect, the porosity of the porous body used in this embodiment is preferably 15% or more and 85% or less, and also preferably 35% or more and 85% or less. In order to achieve the above effect more reliably, the porosity is particularly preferably 15% or more and 60% or less. Note that the "porosity"

herein refers to the ratio of the volume of the voids in the porous body to the total volume of the porous body on the assumption that the voids in the porous body are not filled with the carbon-based covering material.

Note that in the example of FIG. 4, the cover part 550 only covers the top of the head part 520; alternatively, the cover part 550 may cover the entire head part 520. Further, all the voids inside the head part 520 may be filled with the carbon-based covering material of the cover part 550.

On the other hand, in the example of FIG. 4, the straight trunk part 510 is coated with the SiC coating material 530; however, the SiC coating material may be provided on the side surface and the lower surface of the head part 520, that is, surfaces other than the surface covered with the cover part 550.

Further, an epitaxial growth apparatus according to this embodiment has the lift pin 500 described above. The features of the epitaxial growth other than the lift pin 500 may be the same as those used in the typical epitaxial growth apparatus 1 described above with reference to FIG. 1. Further, in a method of producing a silicon epitaxial wafer, according to this embodiment, an epitaxial film is grown on a silicon wafer using an epitaxial growth apparatus having the lift pin 500. This production method can prevent a carbon-based covering material from peeling.

EXAMPLES

Next, in order to clarify the effects of this disclosure, examples are given below; however, this disclosure is not limited to the following examples in any way.

Example 1

Lift pins 500 as depicted in FIG. 4 were prepared. In the preparation of each lift pin 500, the porosity of porous SiC was set to be 40%. A head part 520 of the lift pin 500 was impregnated with a phenol resin to be carbonized, thereby forming a cover part made of glassy carbon. The thickness from the outermost surface of the lift pin 500 (the exposed surface 550A of the cover part 550) to the surface 520A of the head part 520, namely, the surface layer thickness D1 was approximately 40 m. Further, the thickness from the surface 520A of the head part 520 on the abutment side to a surface part filled with the cover part 550 (namely, the deep part thickness D2) was 100 μm. Further, the side surface of the straight trunk part 510 was coated with an SiC coating material using CVD at 1250° C. Note that each thickness was measured by observing a cross section of the lift pin cut after the test using a microscope or a SEM, and the thickness was the average of the values measured after the epitaxial growth of 50 epitaxial films.

Example 2

Pyrolytic carbon was used as a carbon-based covering material unlike in Example 1, in which the cover part made of glassy carbon was formed. A lift pin according to Example 2 was formed under the same conditions as those in Example 1 except for the material of the cover part.

Comparative Example 1

Figure 3:
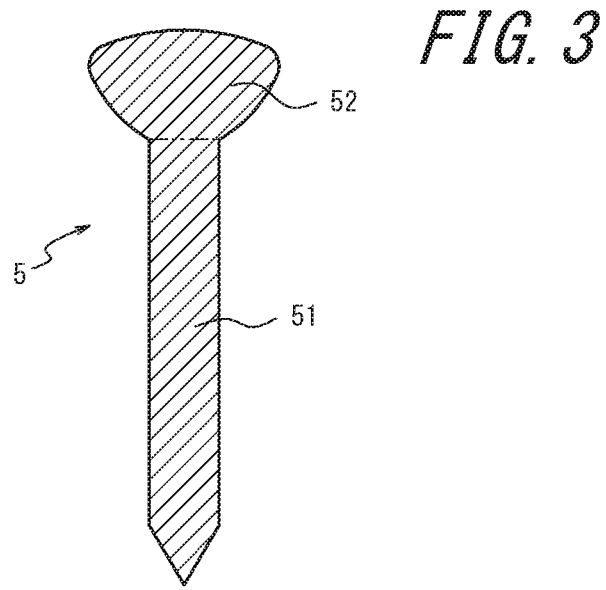
FIG. 3 is a fragmentary cross-sectional view of a lift pin according to conventional techniques.

Lift pins 5 as depicted in FIG. 3 were prepared. A straight trunk part 51 and a head part 52 of each lift pin 5 was made of close-packed (non-porous) SiC. The surface of the head part 52 was coated with glassy carbon to prepare the lift pin of Comparative Example 1.

Comparative Example 2

Lift pins 5 made of SiC alone as depicted in FIG. 3 were prepared as lift pins of Comparative Example 2.

Comparative Example 3

Lift pins 5 made of glassy carbon alone as depicted in FIG. 3 were prepared as lift pins of Comparative Example 3.

The lift pins of Examples 1 and 2 and Comparative Examples 1 to 3 were applied to the epitaxial growth apparatus 1 depicted in FIG. 1 and silicon epitaxial wafers were produced in accordance with the following procedures. Here, a susceptor 4 obtained by coating a surface of a carbon base material with SiC was used. As a substrate for each silicon epitaxial wafer, a boron-doped silicon wafer W having a diameter of 300 mm was used.

In producing the silicon epitaxial wafer, first, trichlorosilane gas was supplied as a source gas at a temperature of 1150° C. to coat the surface of the susceptor 4 with silicon. Next, the silicon wafer W was introduced into an epitaxial film formation chamber 2, and was placed on the susceptor 4 using the lift pins. Subsequently, hydrogen gas was supplied at 1150° C. to perform hydrogen bake; a silicon epitaxial film was then grown to 4 μm at 1150° C., thus an epitaxial silicon wafer was obtained. Here, trichlorosilane gas was used as a source gas, diborane gas as a dopant gas, and hydrogen gas as a carrier gas.

The quality of the front surface and the back surface of the thus obtained silicon epitaxial wafers was evaluated. For Examples 1 and 2, and Comparative Example 1, the lift pins were removed after the epitaxial growth, and whether the carbon-based covering material had peeled or not was determined by visual observation. The results are given in Table 1. The evaluation methods were as follows.

<Front Surface Quality>

The density of 0.25 μm LPDs formed in each resultant epitaxial wafer was measured. Specifically, for each epitaxial wafer prepared, the number of surface defects (light point defects: LPDs) with a size of 0.25 μm or more observed on the epitaxial film surface was evaluated using a wafer surface inspection system (Surfscan SP2 manufactured by KLA-Tencor Corporation). From the results of this measurement, the formation of particles can be evaluated.

Evaluation was made based on the following evaluation criteria:
+: 0.2 or less per wafer
−: more than 0.2 to 0.5 or less per wafer
−−: more than 0.5 per wafer <Back Surface Quality>

For each resultant epitaxial wafer, the area of a region in the abutment area of the lift pin where a scattering intensity for laser reflection not lower than a set value was observed was measured as a pin mark level of the contact portion of the lift pin using a wafer surface inspection system (Surfscan SP2 manufactured by KLA-Tencor Corporation), and the damage on the wafer back surface caused due to the lift pins was evaluated.

Evaluation was made based on the following evaluation criteria:
++: 0.5 $mm^2$ or less
+: more than 0.5 $mm^2$ and 1 $mm^2$ or less −: more than 1 mm² and 2 mm² or less
−−: more than 2 mm²

TABLE 1

|  | Front surface quality | Back surface quality | Peeling of glassy carbon |
| --- | --- | --- | --- |
| Example 1 | + | ++ | No peeling |
| Example 2 | + | ++ | No peeling |
| Comparative Example 1 | − | −− | Peeled |
| Comparative Example 2 | + | −− | N/A |
| Comparative Example 3 | −− | + | N/A |

As demonstrated in Table 1, using the lift pins of Examples 1 and 2 according to this disclosure, the silicon wafer back surface was prevented from being damaged by the lift pins; emission of dust due to rubbing of the lift pins against the wall surface of the through holes in the susceptor was reduced; and the carbon-based covering material was prevented from peeling.

REFERENCE SIGNS LIST

1 Epitaxial growth apparatus
2 Epitaxial film formation chamber
4 Susceptor
5 Lift pin
6 Elevating shaft
W Silicon wafer
11 Upper dome
12 Lower dome
13 Dome fitting
40 Susceptor rotating portion
41 Susceptor support shaft
42 Through hole
500 Lift pin
510 Straight trunk part
520 Head part
530 SiC coating material
550 Cover part

The invention claimed is:

1. A lift pin which is inserted through a through hole of a susceptor placed in an epitaxial growth apparatus so that the lift pin is movable in directions in which the through hole extends, and moves a silicon wafer placed on the susceptor up and down with respect to the susceptor while supporting the silicon wafer, comprising:
   a straight trunk part inserted through the through hole;
   a head part abutting the silicon wafer; and
   a cover part covering at least a top of the head part, wherein:
      the straight trunk part and the head part are made of a porous body,
      the porous body is made of porous SiC,
      a porosity of the porous body is 15% or more and 85% or less,
      the cover part is made of a carbon-based covering material, and
      at least part of voids of the porous body of the head part is filled with the cover part.

2. The lift pin according to claim 1, wherein the straight trunk part is coated with an SiC coating material.

3. The lift pin according to claim 1, wherein the carbon-based covering material of the cover part is made of glassy carbon or pyrolytic carbon.

4. An epitaxial growth apparatus having the lift pin according to claim 1.

* * * * *